US009925678B2

United States Patent
Nicholas

(10) Patent No.: US 9,925,678 B2
(45) Date of Patent: Mar. 27, 2018

(54) RAZOR BLADE WITH A PRINTED OBJECT

(71) Applicant: The Gillette Company, Boston, MA (US)

(72) Inventor: Andrew Charles Nicholas, Winchester, MA (US)

(73) Assignee: The Gillette Company LLC, Boston, MA (US)

( * ) Notice: Subject to any disclaimer, the term of this patent is extended or adjusted under 35 U.S.C. 154(b) by 0 days.

(21) Appl. No.: 14/949,086

(22) Filed: Nov. 23, 2015

(65) Prior Publication Data

US 2016/0297087 A1 Oct. 13, 2016

Related U.S. Application Data

(60) Provisional application No. 62/097,646, filed on Dec. 30, 2014.

(51) Int. Cl.
| | |
|---|---|
| *B26B 21/60* | (2006.01) |
| *B26B 21/40* | (2006.01) |
| *C23C 14/22* | (2006.01) |
| *B26B 21/44* | (2006.01) |
| *B26B 21/54* | (2006.01) |

(52) U.S. Cl.
CPC .............. *B26B 21/60* (2013.01); *B26B 21/40* (2013.01); *B26B 21/4037* (2013.01); *B26B 21/4068* (2013.01); *B26B 21/443* (2013.01); *B26B 21/54* (2013.01); *C23C 14/22* (2013.01)

(58) Field of Classification Search
CPC ..... B26B 21/40; B26B 21/4037; B26B 21/54; B26B 21/60

USPC .................................................... 30/32, 41.7
See application file for complete search history.

(56) References Cited

U.S. PATENT DOCUMENTS 4,211,006 A    6/1980 Halaby et al.

FOREIGN PATENT DOCUMENTS

JP    2004-337540 A    * 12/2004

OTHER PUBLICATIONS

PCT International Search Report with Written Opinion in corresponding Int'l appln. PCT/US2015/064594 dated Apr. 13, 2016.

* cited by examiner

*Primary Examiner* — William P Fletcher, III
(74) *Attorney, Agent, or Firm* — Joanne N. Pappas; Kevin C. Johnson; Steven W. Miller

(57) ABSTRACT

A method of making a razor cartridge including providing at least one razor blade having a cutting edge extending along a length of the razor blade and printing at least one printed object on the length is provided. The razor blade is positioned between the guard and the cap where the visible surface of the at least one razor blade includes a printed object. The printed object may extend continuously along the length of the razor blade and/or may have multiple portions having a comb-like structure. The printed object appears as a solid object to a viewer's naked eye. The solid object includes a plurality of printed ink dots not visible to the viewer's naked eye. The printed object of flexible, polymer ink may act as a guard element on the razor blade which helps with glide and to manage a user's skin (e.g., bulge) during shaving.

19 Claims, 16 Drawing Sheets

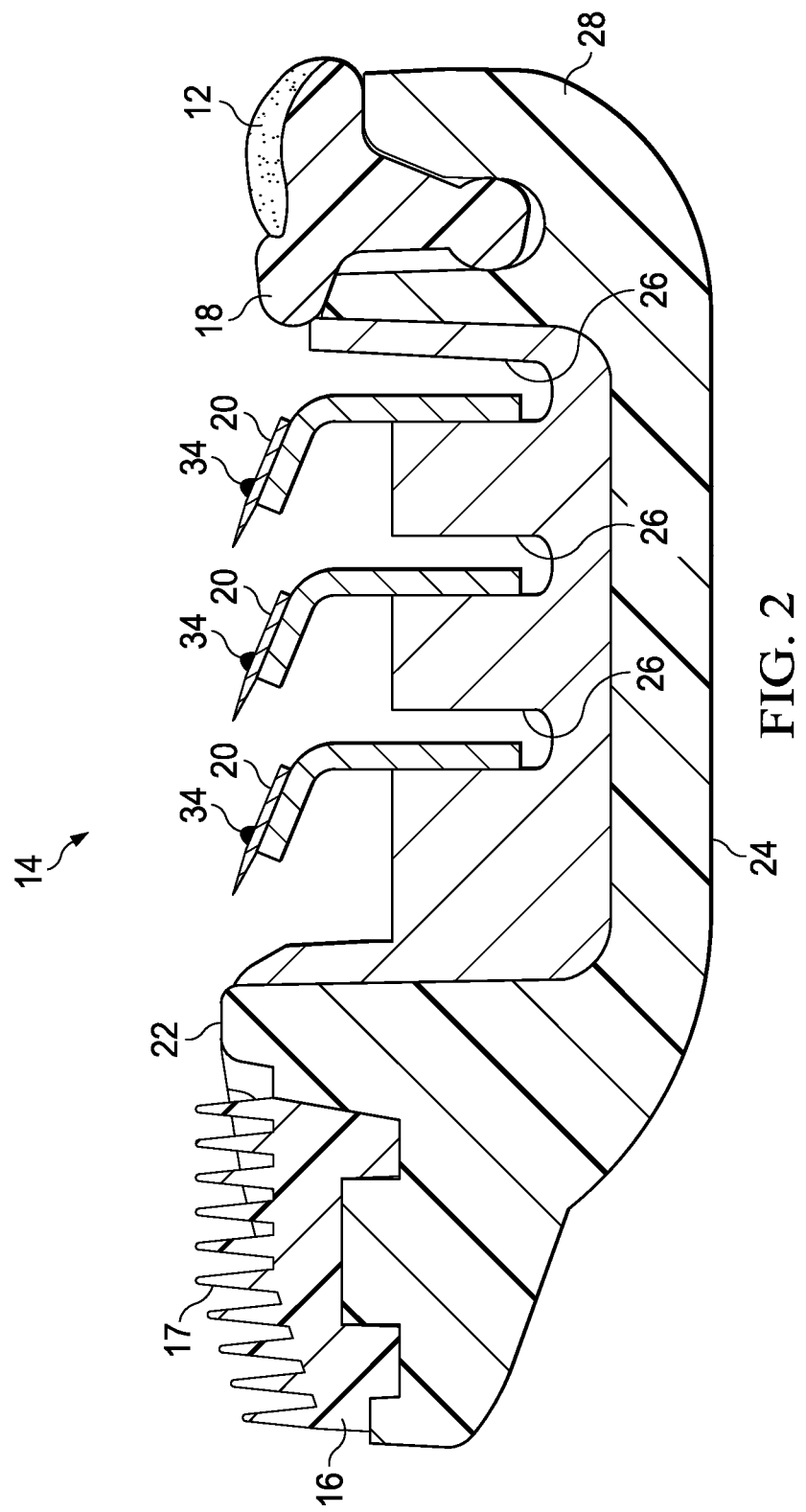

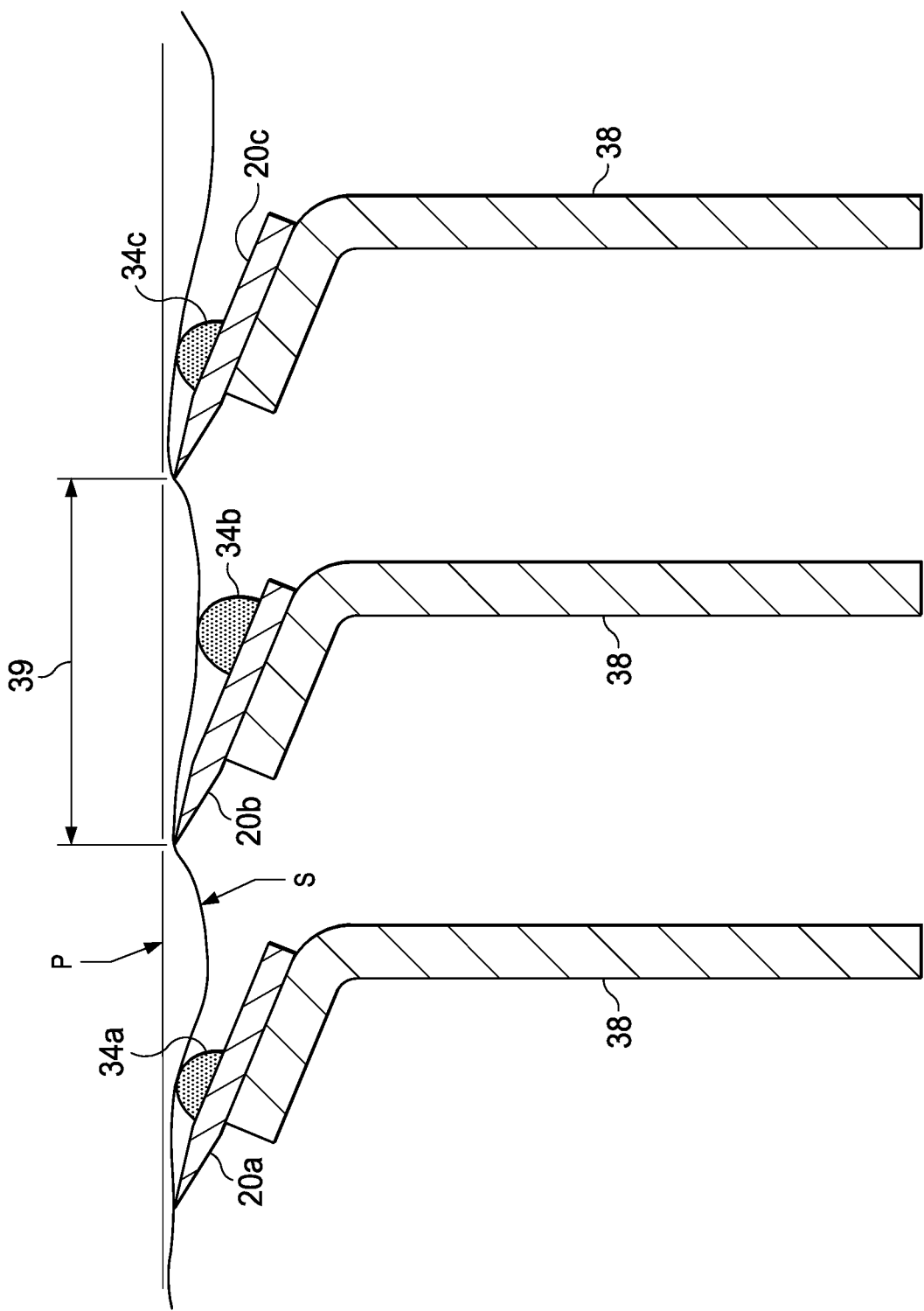

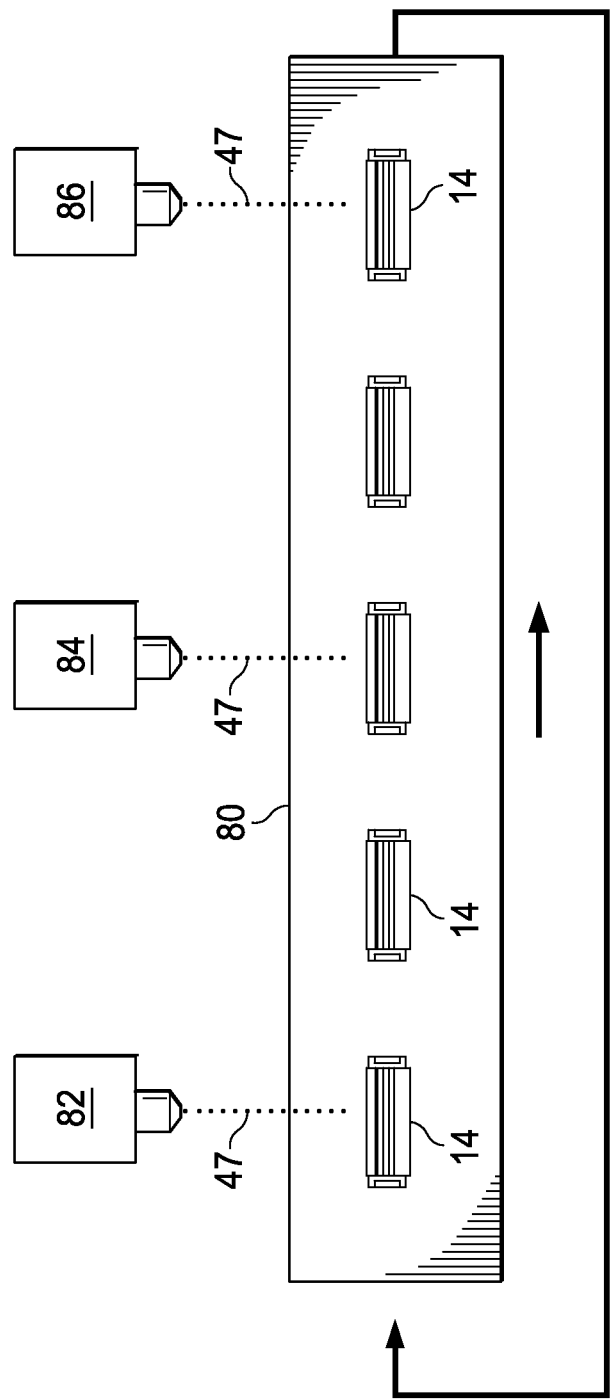

RAZOR BLADE WITH A PRINTED OBJECT

FIELD OF THE INVENTION

The invention relates to razors, and more particularly to razor cartridges having razor blades with printed objects or printed portions.

BACKGROUND OF THE INVENTION

Users of wet shaving razors are susceptible to excessive nicking and cutting. There are many possible explanations for this, but one of them is how the razor blade glides over the skin and how the skin bulge in front of the blade edge is managed. Moreover, as the number of razor blades per cartridge increases, the total blade drag on skin against the skin can also increase.

Most razor blades on the market are produced by applying one or more coatings such as thin film hard coatings to sharpened stainless steel substrates. These coatings may typically deposited on blade edges by Physical Vapor Deposition (PVD) techniques which include vacuum conditions where raw materials, referred to as target materials, i.e., the material that is going to be deposited, are generally in solid form. Common PVD techniques incorporate processes such as sputter coating or Pulsed Laser Deposition (PLD).

Blade coatings were developed to minimize the irritation produced by excessive pulling of hairs which generally may continue for a considerable period of time after the pulling has ceased.

Thin hard coatings have certain roles and advantages. One advantage is that the hard coatings generally strengthen blade edges, particularly those with slim profiles, by providing reinforcement to the edges, thus protecting the edges from excessive damage during shaving.

In addition, since conventional razor blades used for wet shaving generally have increasing cutting forces with use, due to the outer coating wear and adhesion loss, most commercial razor blades also include one or more subsequent depositions of outer coatings (e.g., TEFLON® or telomer coatings, or other polymeric material coatings).

A thin polymer coating on the blade edge is generally lubricious with an inherent hydrophobic nature which causes a film of water droplets of a microscopic scale to remain on the cutting blade edge. This in turn enhances the effect of the polymer coating, and can reduce the frictional resistance between the blade edge and the skin and thereby reduce the cutting force of the hair, greatly improving shaving comfort. Such coatings are described, for example, in U.S. Pat. Nos. 5,645,894 and 5,263,256, the entire disclosures of which are incorporated by reference herein.

In general, this polymer coating is applied only to the tip of the razor blade (e.g., the last 25-50 µm) as it is generally sprayed onto blades edges which are generally arranged in a stack of blades.

Accordingly, a significant portion of the razor blade is not covered with the lubricious coating but instead maintains some contact with the skin.

This may be a disadvantage generally as frictional resistance may remain in uncoated areas, resulting in more tug and pull of a user's skin.

It is an object of the invention to provide a razor blade with improved skin protection, (e.g., comfort and safety) by improving the way the blade or blades in a cartridge glides over the skin and providing better management of skin bulge, thus minimizing the number of nicks and cuts experienced by a user, while maintaining or improving rinsability of the razor cartridge.

It is an object of the invention to provide a razor blade with an improved visual appearance over traditional razor blades.

It is an object of the present invention to use the visual element of the razor blade in the control of the amount of skin bulge occurring to the user during shaving.

SUMMARY OF THE INVENTION

In some embodiments, the invention can improve shaving comfort and safety by improving the way the blade and cartridge glides over the skin and providing better management of the skin bulge, thus minimizing number of nicks and cuts experienced by a user.

The present invention for a method of making a razor blade for a razor cartridge, includes the steps of providing a razor blade, the razor blade having a first side, an opposing second side, and a cutting edge extending along a length of said razor blade; printing at least one printed object on a length of said razor blade.

In the present invention, the at least one printed object is on the first side of the razor blade, is adjacent to the cutting edge, is on a blade body portion, extends continuously along the length of said razor blade, and/or has a surface adapted to contact a skin surface of a user during a normal use of the razor cartridge.

In the present invention, the printing is inkjet printing, a UV curable ink, a polymer-based ink, and/or a flexible ink.

The printed object has a height dimension of from about 0.04 mm to about 0.20 mm as measured in a direction perpendicular to one of the sides of the razor blade. The printed object is printed on the razor blade at a distance of about 0.2 mm and about 0.8 mm back from a blade edge.

The printed object includes a plurality of solid objects of one or more printed dots wherein the printing step is repeated until a three-dimensional structure of a plurality of printed dots is formed. The 3-D structure is a cone shape and may include one or more colors. There may be free portions within the solid object with no printed dots and there may be substantially no free portions between said printed dots.

The printed object of the present invention is visible to a user.

In another aspect, a razor blade for a razor cartridge includes a first side, an opposing second side, and a cutting edge extending along a length of the razor blade; and a printed object printed on the first side of the razor blade along the length of the razor blade adjacent to the cutting edge, the printed object including a surface adapted to contact a skin surface of a user during a normal use of the razor cartridge including the razor blade. The printed object may extend continuously along a first side of the razor blade.

In yet another aspect of the present invention, a razor cartridge includes one or more blades each with a first side with a printed object printed on at least one of the first sides thereof.

BRIEF DESCRIPTION OF THE DRAWINGS

While the specification concludes with claims particularly pointing out and distinctly claiming the subject matter which is regarded as forming the present invention, it is believed that the invention will be better understood from the following description which is taken in conjunction with the accompanying drawings in which like designations are used to designate substantially identical elements, and in which:

FIG. 2 is a sectional view taken along line 2-2 of FIG. 1.

FIG. 3I is a close-up sectional view of a still further embodiment of the present invention.

FIG. 6 is a side view of a printing process of the present invention.

DETAILED DESCRIPTION OF THE INVENTION

Figure 1:
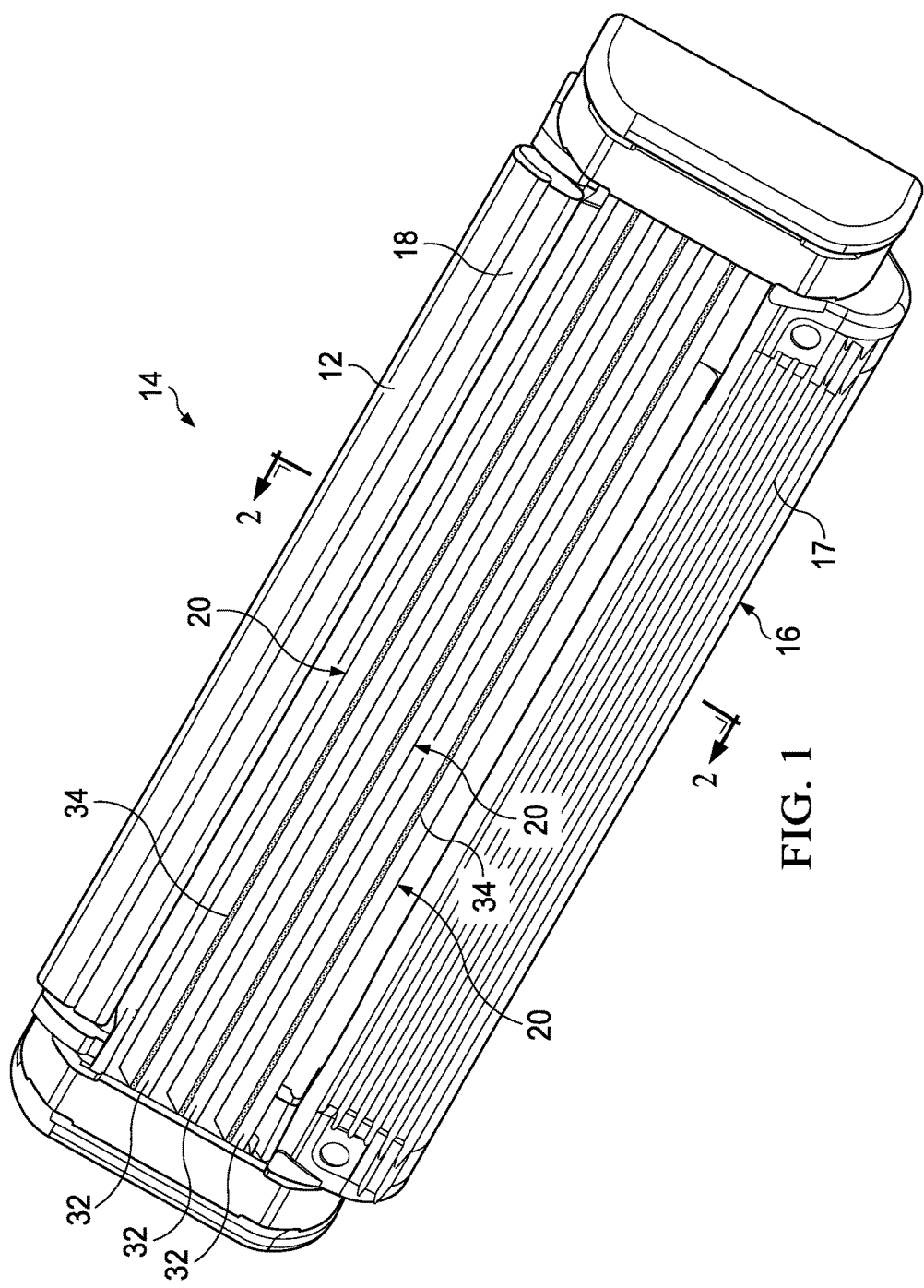
FIG. 1 is a perspective view of a razor cartridge of the present invention.

Referring to FIGS. 1-3, the razor cartridge 14 includes a guard 16 positioned at a front portion of the cartridge 14, a cap 18 positioned at a back portion of cartridge 14, and blades 20 positioned between guard 16 and cap 18. Cartridge 14 includes a top surface 22 and an opposing bottom surface 24. A lubricating member 12 is positioned on the top surface 22 of the cartridge 14. Blades 20 have a first side 30a which has a visible top surface 32.

The guard 16 may include one or more elongated flexible protrusions 17 to engage a user's skin. The flexible protrusions 17 include flexible fins generally parallel to the one or more elongated blades 20. In another embodiment, the flexible fins have at least one portion which is not generally parallel to the one or more elongated edges. Non-limiting examples of suitable guards include those used in current razor blades and include those disclosed in U.S. Pat. Nos. 7,607,230 and 7,024,776; (disclosing elastomeric/flexible fin bars); 2008/0034590 (disclosing curved guard fins); 2009/0049695A1 (disclosing an elastomeric guard having guard forming at least one passage extending between an upper surface and a lower surface). The upper surfaces of lubricating member 12 along with those of the guard 16, cap 18 and blades 20 form the skin engaging portion of the cartridge 14.

The razor blades are preferably mounted in slots or openings 26 in a housing or frame 28 of the cartridge 14 as shown in FIG. 2, though any other feasible means of attachment of the blades are contemplated herein.

The ink of the present invention is preferably ultra-violet (UV) curable ink. UV curable inks are generally monomer or oligomer based with photosensitive molecules that initiate a polymerization reaction (e.g. curing) when exposed to UV light. This reaction is near instantaneous once the ink lands on the part (milliseconds). The cross linking that occurs during curing provides a durable ink surface with good adhesion to the part.

There are two suitable types of UV curable ink that may be used—free radical and cationic. Both free radical and cationic UV inks are cured when exposed to UV light. When free radical inks are exposed to UV light a photo initiator absorbs the UV light generating free radicals which react with double bonds causing chain reaction and polymerization. When cationic inks are exposed to UV light a photo initiator absorbs the UV light generating a Lewis acid which reacts with epoxy groups resulting in polymerization.

The high cure rates of UV curable inks translate into very high operating speeds. Thus, UV curable inks can be advantageously run on high-speed production equipment without having to allow for excessively large dryers, as would be necessary for other ink systems. The rapid cure rate also allows UV curable inks to be used to provide multiple layers in succession without having to necessarily move the substrate after each layer. This in turn allows for elevation, structuring (layering), and colors to be easily incorporated.

UV curable ink drops cured on top of one another will build an elevated structure with a plastic rigidity due to the polymeric nature of the chemistry. The rigidity will be able to hold the skin back and minimize the skin bulge between blades. The life of the structured support (e.g., printed object) and degree of rigidity will be controlled by the UV ink chemistry and the spacing of the dots (e.g., flexibility of structure or wear rate can vary). For instance, generally dictated by the polymer chain length, some UV ink formulations provide flexibility or more flexibility as compared to others which are rigid or provide more rigidity. There are a wide range of inks available from INX International Co. which have rigid, multiflex, and stretch attributes. The more flexible and polymeric the inks are, the more the printed object acts as a guard-like element on the razor blade which helps with glide and to manage a user's skin (e.g., bulge) during shaving.

Some inks are pigmented and some provide a clear coat. The clear coat is generally a top varnish that can be used to protect and/or strengthen the ink surface. Thought not required a varnish layer may assist in curtailing a printed skin guard surface from wearing away. The present invention contemplates that any feasible mixture of types of inks or other printable materials can be printed onto the razor blade surface.

Figure 3A:
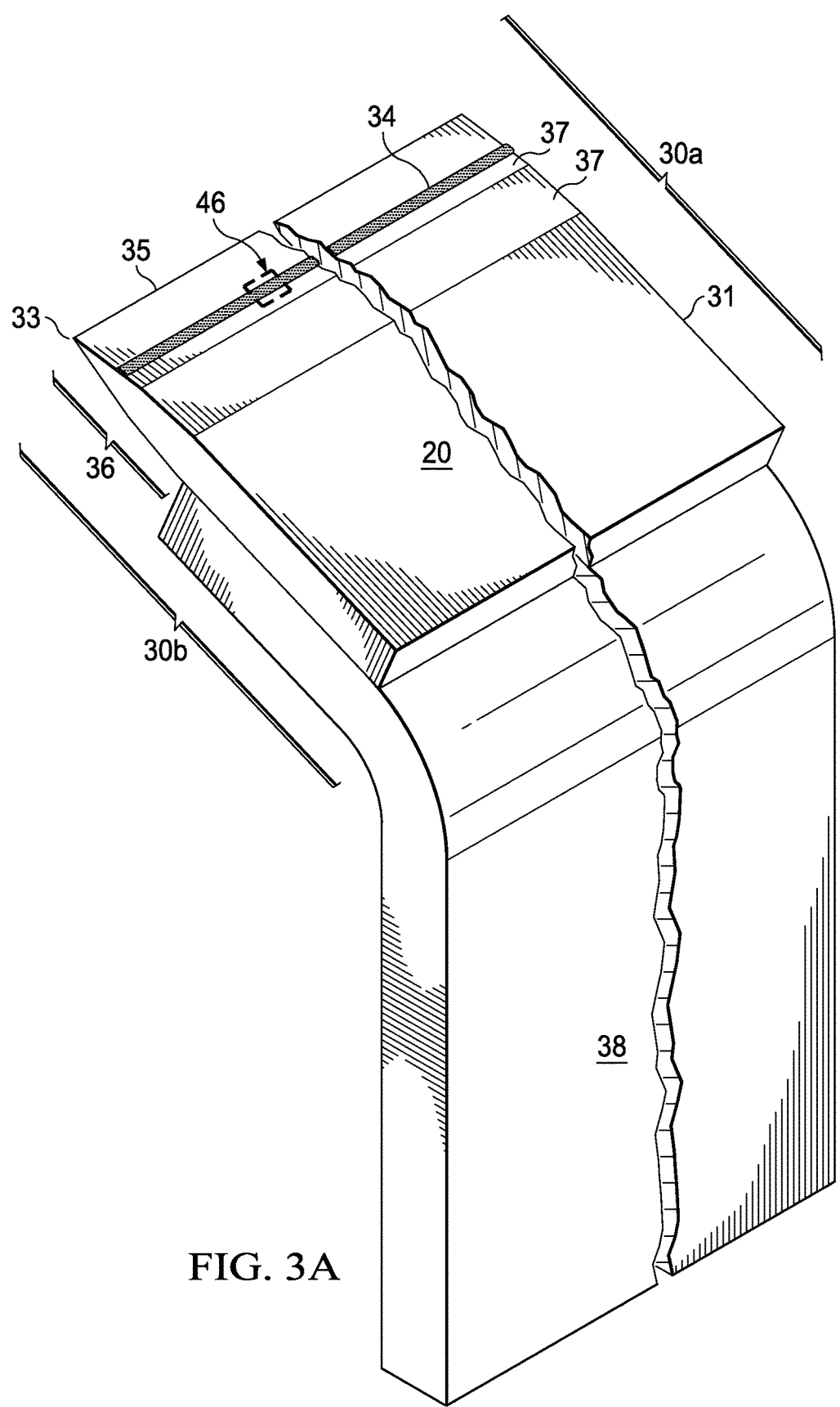
FIG. 3A is a side elevation view of a blade supported razor blade of the present invention.
Figure 3B:
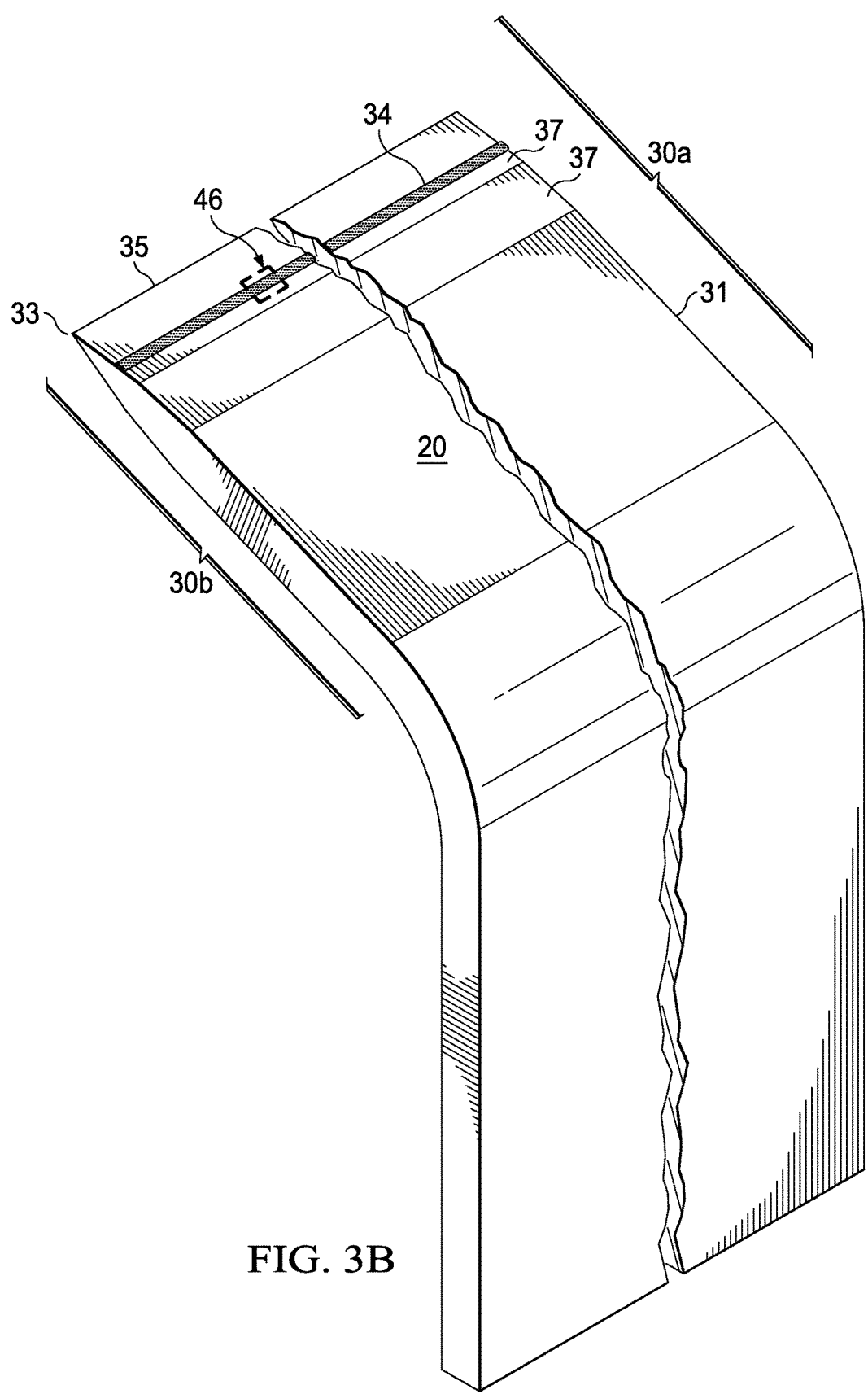
FIG. 3B is a side elevation view of a bent razor blade of the present invention.
Figure 3C:
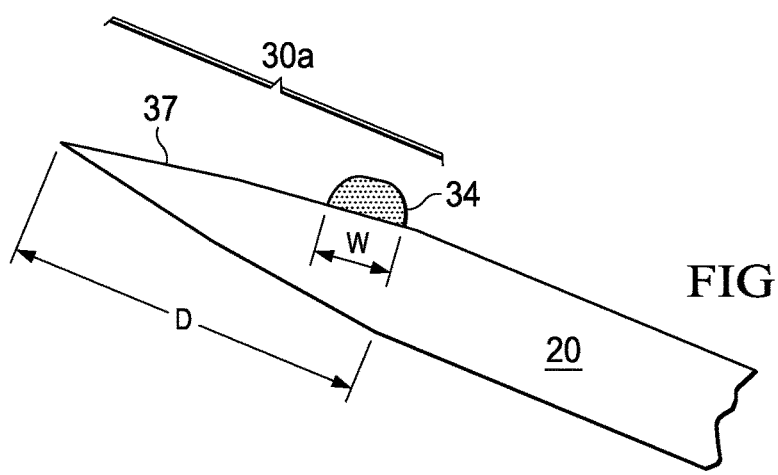
FIGS. 3C-3D are cross-sectional views of blades of FIG. 3A or 3B.
Figure 3D:
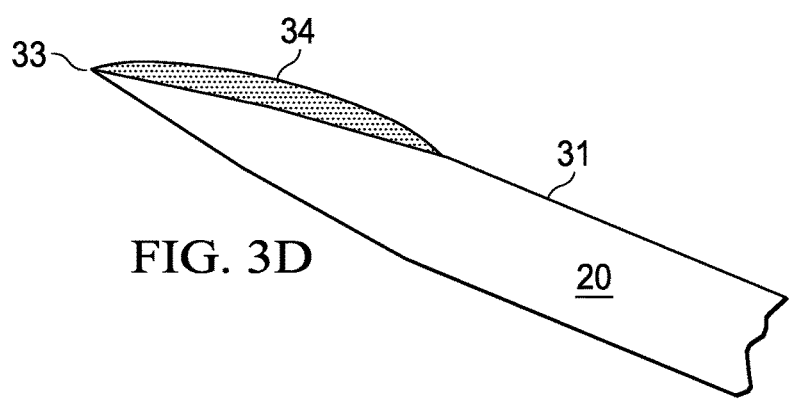
Figure 3E:
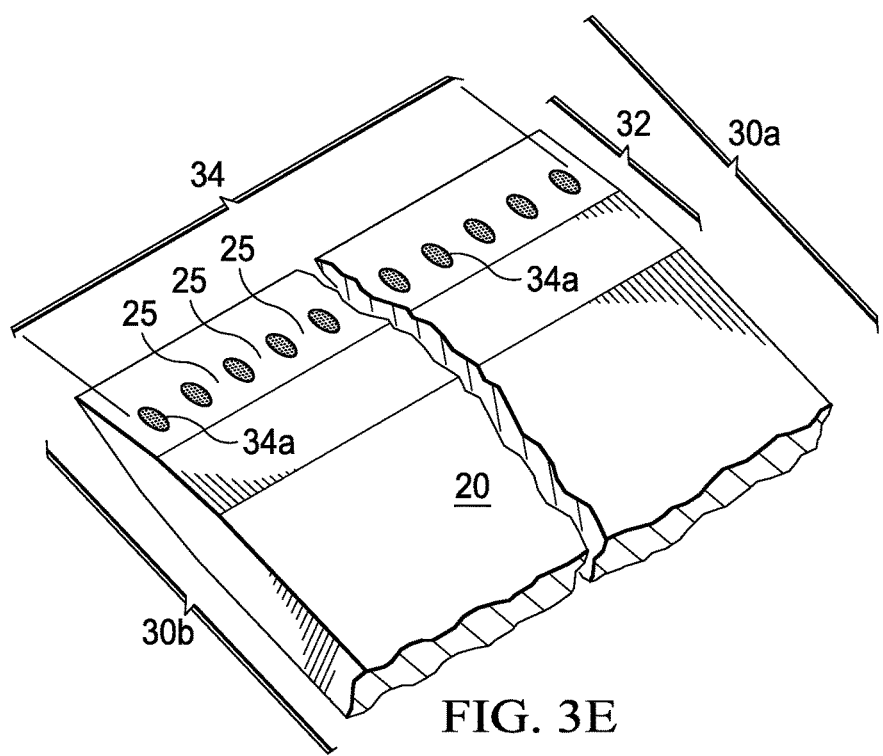
FIG. 3E is a side perspective view of a blade of FIG. 3A or 3B.

The term "razor blade" in the present invention may desirably signify a substrate or a coated substrate. A substrate is generally comprised of stainless steel which includes a blade body and at least one flank. Desirably, a razor blade includes two flanks forming a blade edge and a blade body. The two flanks intersect at a point or tip, or what is oftentimes referred to as the ultimate tip. Each flank may have one, two, or more bevels. The blade body is generally the remaining area of the razor blade beneath the flanks or bevels. As shown in FIG. 3A, a perspective view of a blade 20 includes blade body 31, two bevels 37 for each of two flanks 36 which intersect at tip 33 forming an edge 35. As shown in FIG. 3C and FIG. 3E, the blade 20 has a first side 30a and a second opposing side 30b, the latter side connected to blade support 34. The blade 20 of the present invention may be of the bent blade type shown in FIG. 3B where the second opposing side 30b of the blade 20 is not connected to a blade support as the blade and support are generally integrated.

A "substrate" signifies one of the substances or materials which may be acted upon by the printing process resulting in a printed structure in the present invention. It is contemplated that the substrate of the present invention may also be comprised of other metals, plastic, paper, glass or any other substance. Illustrative embodiments herein generally relate to a stainless steel substrate as it is most commonly used for razor blade formation.

Most razor blades on the market are produced by applying one or more coatings such as thin film hard coatings to sharpened stainless steel substrates. These coatings may typically deposited on blade edges by Physical Vapor Deposition (PVD) techniques which include vacuum conditions where raw materials, referred to as target materials, i.e., the material that is going to be deposited, are generally in solid form. Common PVD techniques incorporate processes such as sputter coating or Pulsed Laser Deposition (PLD).

Blade coatings were developed to minimize the irritation produced by excessive pulling of hairs which generally may continue for a considerable period of time after the pulling has ceased.

Thin hard coatings have certain roles and advantages. One advantage is that the hard coatings generally strengthen blade edges, particularly those with slim profiles, by providing reinforcement to the edges, thus protecting the edges from excessive damage during shaving.

In addition, since conventional razor blades generally have increasing cutting forces with use due to the outer coating wear and adhesion loss, most commercial razor blades include one or more subsequent depositions of coatings (e.g., TEFLON® or telomer coatings or other polymeric material coatings.

Thus, in addition to being deposited directly on a substrate of a razor blade, the printing process and resultant printed structure of the present invention may also be deposited directly on a coated substrates (e.g., vacuum deposited coatings or outer polymeric coatings) which are already disposed on the substrate of the razor blades.

The visible surface 32 on a first side 30a of razor blade 20 includes a printed object 34. The printed object 34 shown in FIGS. 1-3I is an object covering a portion of the first side 30a of the razor blade. For skin support benefits, this portion of the blade where the object is printed is preferably within a visible surface 32 (e.g., most visible surfaces are likely those shown in FIGS. 3A, 3B, 3C) of the first side 30a. Furthermore, the printed object 34 may cover the entire visible surface 32 of first side 30a of razor blade 20 (e.g., FIG. 3D).

FIG. 3E depicts a printed object 34 across the length of the razor blade 20 where the object comprises a plurality of smaller printed objects 34a (or clusters of solid objects) across the length of the razor blade 20 with spaces or open pathways 25 in between them.

During shaving, pathways 25 of razor blade 20 may generally be directly exposed to the shaving environment which includes water, shave preparations, and skin. This direct exposure to the shaving environment allows for the water, shave preparations and debris to rinse through the pathways more easily than without them.

In addition to assisting with rinsing, the pathways 25 and the printed objects 34a minimize blade drag on skin and increase glide in the shaving direction, acting as skis or runners or as a comb-like structure to provide skin support and management (e.g., bulge).

Though each object 34a is shown as generally being a similar size, any size, shape and number of printed objects 34a may be printed on the razor blade in the present invention. Thus, a printed object 34a may comprise a letter or logo or other graphic or design visual element.

It should be noted that all the printed objects of FIGS. 3A-3I are shown disposed on a first side of the razor blade.

Figure 3F:
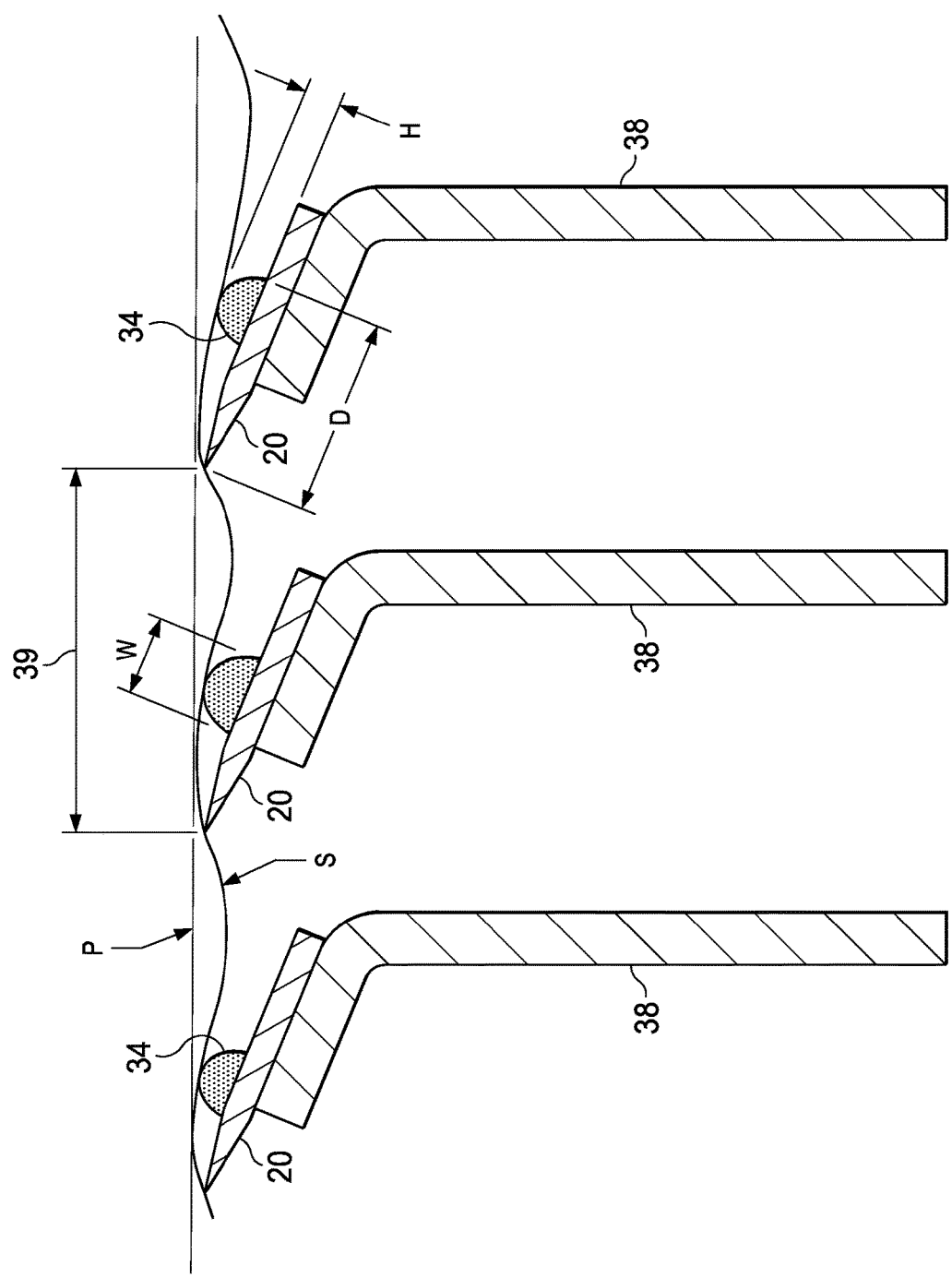
FIG. 3F is a close-up sectional view of FIG. 2.

The printed object may be disposed from about 0.2 mm and about 0.8 mm within a blade span. A blade span generally signifies the distance 39 between the blade tips of adjacent blade edges, as shown in FIG. 3F. Also shown in FIG. 3F is the skin surface line S indicating where the skin contacts the blade 20 and the upper surface 34' of printed object 34 during shaving. The printed object assists in propping up the skin up rather than letting the skin bulge into or fall into the area in the span 39 of the blades as shown by skin surface S in FIG. 3F. By minimizing skin bulge, the user experiences less tug and pull of the razor blades which generally results in less nicks and cuts on the skin.

The position of each printed object 34 relative to the shave plane P may be independent of each of the blades 20 and/or the other printed objects 34.

It may be beneficial to have the printed objects in a multiple-blade razor cartridge be of the same type, be of varying types (e.g., of a different number, shape, geometry or size), be all in the same location on the razor blade, or some or all in varying, different locations on the razor blades in the cartridge.

Figure 3G:
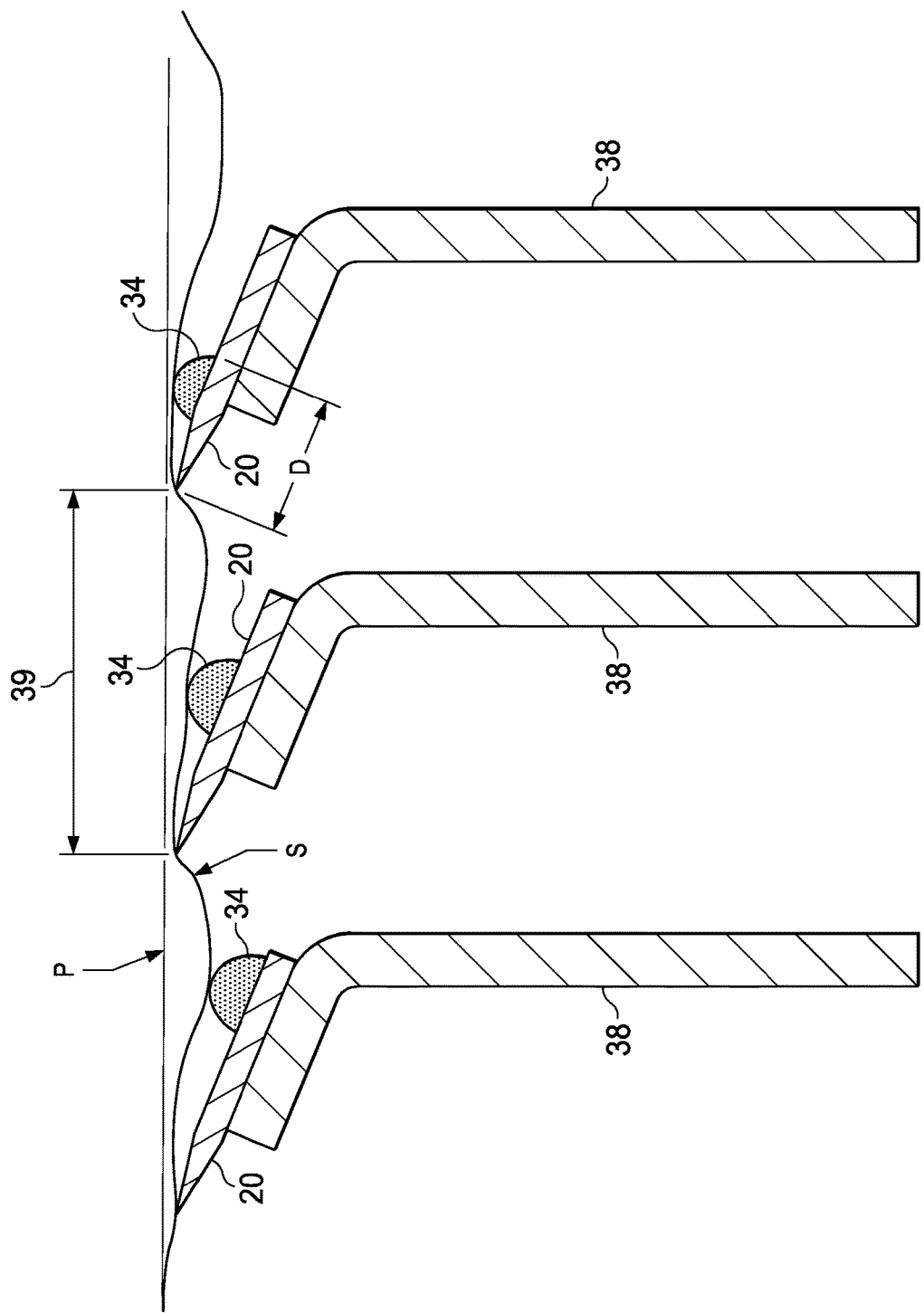
FIG. 3G is a close-up sectional view of an alternate embodiment of FIG. 2.

For instance, FIG. 3G shows printed objects 34 on each blade 20 such that, left to right, they are disposed progressively closer to the blade tip 33. This arrangement may generally be beneficial as it provides the guard-like qualities of the printed object at the back of the cartridge (right-most blade) than at the front of the cartridge (left-most blade) since the right-most blade may be the blade that is cutting the least amount of hair and thus, the printed object provides more skin protection in the direction of the shave.

Figure 3H:
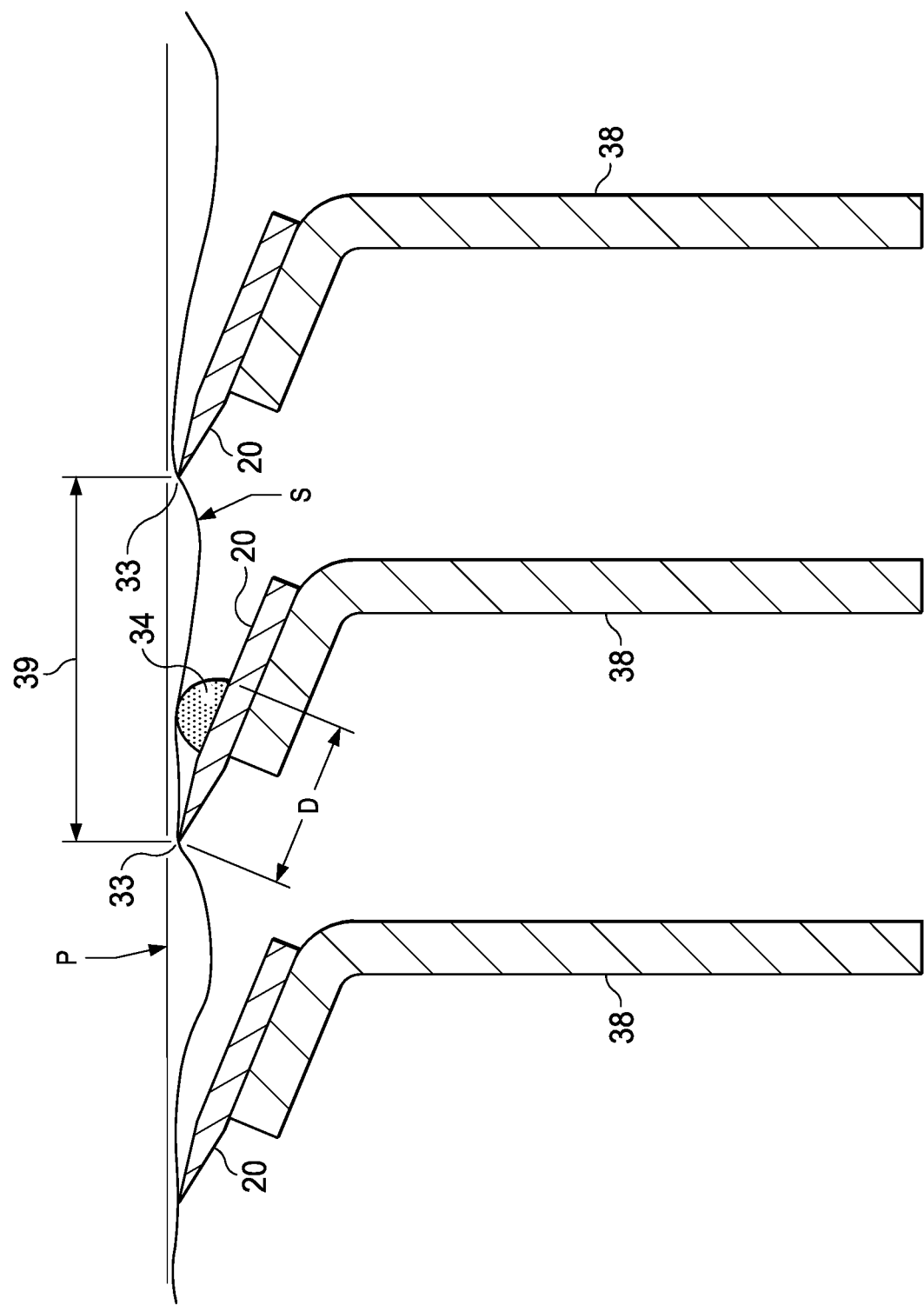
FIG. 3H is a close-up sectional view of a further alternate embodiment of the present invention.

It is also contemplated in the present invention that only one razor blade in a razor cartridge has a printed object printed thereon, such as a centrally located blade 20 as shown in FIG. 3H. By being disposed on the middle blade of a 3-bladed razor cartridge, the bulge into the span is minimized and the angle to the tip of the next blade in the shaving path is reduced thereby reducing bulge and assisting in improving the comfort of the last blade in the razor cartridge. The last or back blade in a 3-bladed cartridge is closest to the cap. This last blade (or the last blade or last few blades in a 4-or-more bladed cartridge) are generally shaving bare skin as hair and shave preparation have substantially been removed by the first blade or blades towards the guard. Accordingly, improving user comfort provided by the blade or blades at or towards the back end of the cartridge is important.

Also contemplated in the present invention is a razor cartridge with different sized printed objects on more than one razor blade but not on each razor blade in the razor cartridge. For instance, as shown in FIG. 3I, the middle blade 20b has the largest printed object 34b while blades 20a and 20c have smaller printed objects 34a and 34c. This arrangement provides an enhanced skin management benefit as the skin bulge may tend to be greatest. Not shown, but also contemplated in the present invention, is an arrangement having only two printed objects, for instance, having only printed objects 34b and 34c on blades 20b and 20c.

Though any shape is contemplated in the present invention, the printed object as shown in FIGS. 3A-3I is preferably cone-shaped or sloped having a smooth contour and a height dimension H of from about 0.04 mm to about 0.20 mm as measured in a direction perpendicular to the sides of the razor blade, a preferable width dimension W of about 0.01 to about 1.0 mm and more preferably from about 0.2 nn to about 0.8 mm in a direction from the blade tip back to the end of the blade body along a side of the razor blade in a direction from the blade tip back to the end of the blade body along the razor blade length and is generally printed at a distance D of about 0.2 mm and about 2.0 mm back from a blade edge to the back side of the printed object.

The printed object 34 appears as a solid object 46 to a viewer's naked eye. Generally, when the perpendicular distance between the viewer's eye and the visible surface on the first side is about 30 centimeters, a viewer looking at the visible surface 32 or the first side of razor blade 20 will see a solid object 46 and will not see or visually perceive any of the underlying razor blade 20.

Figure 4:
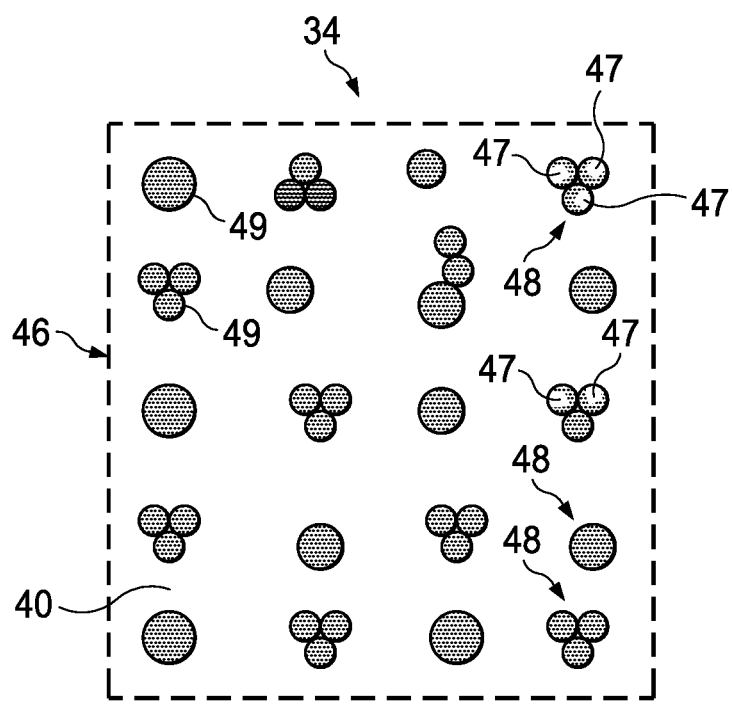
FIG. 4 is an enlarged view of a portion of the razor blade shown in FIG. 1.

Referring now to FIG. 4, solid object 46 comprises a plurality of individual printed dots 48 as they would be seen by the eye under a microscope. The individual printed dots 48 are spaced apart from one another such that free portions 40 of razor blade 20 within the solid object 46 contain no printed dots 48. That is, adjacent individual printed dots 48 are spaced apart from one another such that adjacent individual printed dots 48 do not touch one another. When adjacent individual printed dots 48 are spaced apart from one another, the periphery 49 of adjacent individual printed dots 48 do not overlap or touch one other creating free portions 40 of razor blade 20. Free portions 40 contain no printed dots 48 leaving free portions 40 exposed to the external environment. Each printed dot 48 may be comprised of a single printed droplet 47 or may be comprised of two or more, i.e., several, many, numerous, printed droplets 47 which together form a single individual printed dot 48.

A printed dot 48 made of a single printed droplet 47 will generally wear away faster compared to a printed dot 48 made of multiple printed droplets 47 having the same dimensions as the single printed droplet.

It is contemplated that a looser dot arrangement, for instance, an arrangement with smaller printed dots 48 and larger free portions 40 around them as shown in FIG. 4 may provide more flexibility of the printed object. However, this arrangement may also wear faster which, depending on the intended application, may or may not be advantageous. For instance, it may be advantageous and adequate if such a dot arrangement were printed on a blade or blades of a disposable type razor which is thrown out after one or two shaves.

On the contrary, if the solid objects were constructed of substantially solid printing coverage with little or no free portions, the printed object would wear slowly eventually exposing the underlying razor blade. With the absence, or near-absence of free portions, the benefits provided by the printed object may generally be maintained for longer, such as those of improved glide and skin management (e.g., reduced skin bulge) while also minimized the wear rate of the printed object. The benefit of reduced skin bulge is provided because the printed object comprising solid objects assists in propping the skin up rather than letting the skin bulge into the span of the blades as shown by skin surface S in FIG. 3G and noted in FIG. 4A. In addition, more and larger printed dots with less spacing or free portions 40 between printed dots 48 generally results in longer lasting printed objects for the user during the shave.

The printed object will, with over time and with repeated use, wear away to expose the underlying razor blade.

Thus, it is understood that the size, number, spacing of printed dots 48 and also the number or layers of solid objects 46 which make up the printed object 34 all play a role in the control the skin bulge of the user's skin during the shave, and allow for better glide, rinsability, and affect wear rate of the printed object.

The size of the printed dots 48 may be consistent throughout the solid object 46. The size of the printed dots 48 may vary throughout the solid object. The spacing between printed dots 48 may be consistent throughout the solid object 46. The spacing between printed dots 48 may vary throughout the solid object 46. For example, it may be desirable to have the size of the printed dots 48 larger and the spacing between printed dots 48 smaller at least near the periphery of the solid object so as to increase glide, skin support, and minimize wear at least near the periphery. Or it may be desirable to have the size of the printed dots 48 smaller and the spacing between printed dots 48 larger near the center of the solid object so as increase the flexibility of the printed object and if desired, increase the wear rate.

The size of the printed droplets 47 may be consistent throughout the solid object 46. The size of the printed droplets 47 may vary throughout the solid object.

Figure 4A:
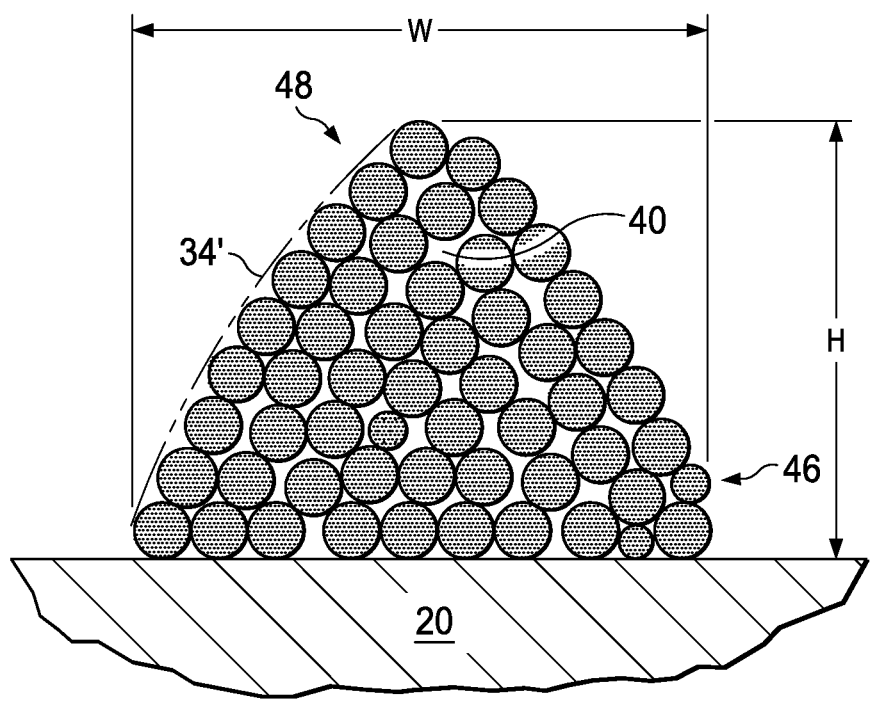
FIG. 4A is a cross-sectional side view of a printed object of the present invention.

Referring now to FIG. 4A, a printed object 34 formed of multiple solid objects 46 is shown. The solid objects may be disposed one on top of each other or the printed dots may be applied randomly to form a desired three-dimensional structure of the printed object. The printed object 34 in FIG. 4A has a cone or tree-like cross-section with a smooth or curved outer surface 34', though any feasible shape and size is contemplated in the present invention. As can be seen, FIG. 4A depicts larger printed objects 34 with smaller free portion areas 40. This arrangement generally provides better glide and skin management such as skin bulge while also minimizing the wear rate of the printed object.

The printed dots may be applied with any suitable type of device including, but not limited to print heads, nozzles, and other types of material deposition devices. Any suitable type of print heads can be used including, but not limited to inkjet print heads. In certain embodiments, the deposition device is an ink jet print head. The print heads may be of a non-contacting, digital type of deposition device. By "non-contacting", it is meant that the print heads do not contact the surface to be printed. By "digital", it is meant that the print heads can apply droplets of ink only where needed such as to form a pattern in the form of words, figures (e.g., pictures), or designs.

Ink jet print heads will typically comprise multiple nozzles. The nozzles are typically generally aligned in rows and are configured to jet ink in a particular direction that is generally parallel to that of the other nozzles. The nozzles within each row on a print head can be aligned linearly. Alternatively, the nozzles may be in one or more rows that are oriented diagonally relative to the longer dimension (or length) of the print head. Both such arrangements of nozzles can be considered to be substantially linearly arrayed. The inkjet print heads can comprise any suitable number and arrangement of nozzles therein. One suitable inkjet print head contains approximately 360 nozzles per inch (per 2.54 cm). The Xaar 1001 is an example of a suitable print head for use herein, and is available from Xaar of Cambridge, UK.

The print heads print droplets of ink. The droplets of ink can range in diameter from about 10 microns or less to about 200 microns, or more. The droplets of ink can be distributed in any suitable number over a given area. Typically, in ink jet printing, the ink droplets form a matrix in which the number of drops per inch (DPI) is specified in the direction of movement of the print head or article to be printed, and in a direction on the surface of the article perpendicular thereto. The application of ink droplets provided on the surface of the razor blade to form a solid image can range from about 80, or less up to about 2,880 or more droplets per inch (DPI) in at least one direction.

The apparatus can comprise a printing apparatus with any suitable number, arrangement, and type of print heads. For example, the apparatus may comprise between 1-20, or more, print heads. The print heads may be arranged in a spaced apart relationship. Alternatively, one or more of the print heads may be positioned adjacent and in contact with another one of the print heads.

If there is more than one print head, the different print heads can print colors such as cyan, magenta, yellow, and black, or any other combination of any desired colors.

Figure 5:
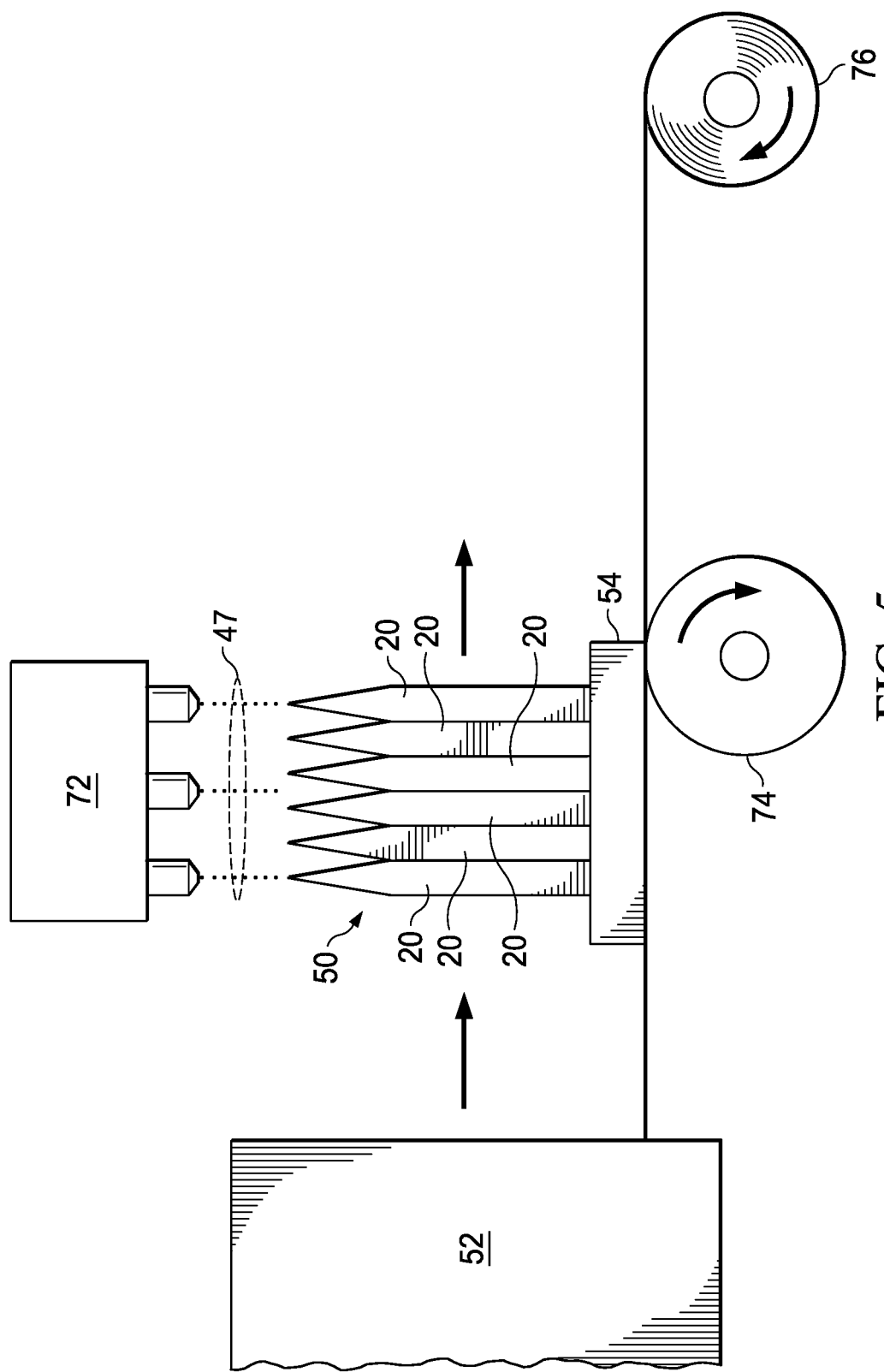
FIG. 5 is a side view of a printing process of the present invention.

Referring to FIG. 5, there is shown a stack 50 of blades 20 as they exit a sputter chamber 52. Printing station 72 containing one or more print heads 72a which print ink in the form of droplets 47 on razor blades 20, as shown in FIG. 4. The stack of razor blades is supported by a carrier 54 which sits on a roller 74 until taken up by an end or wind up roll 76. In order to print the desired object of certain dimensions on the razor blade, more print heads or as many printing stations as may be needed to provide the appropriate structural build up are added.

Referring to FIG. 6, there is shown a web 80 carrying independent cartridges 14 such as shown in FIG. 1. Cartridges 14 pass under print stations 82, 84 and 86 which print ink in the form of droplets 37 on one or more razor blades 20 such as shown in FIG. 4. Cartridges 14 are then passed to the next processing station by web 80.

Figure 7A:
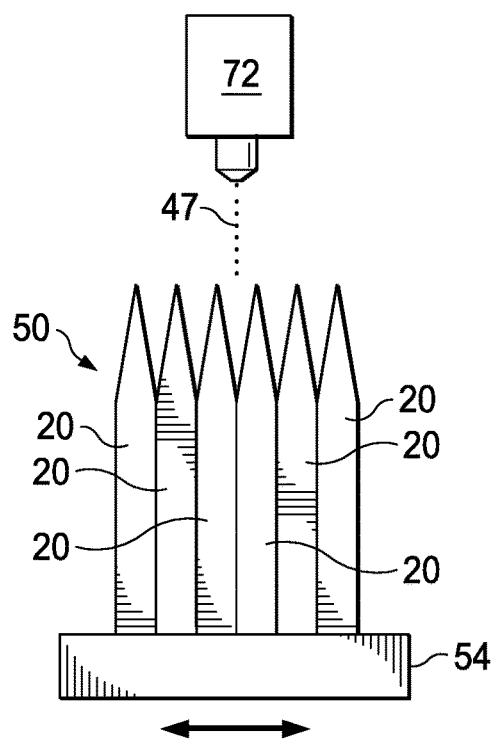
FIGS. 7A-7B are side views of a printing process of the present invention.
Figure 7B:
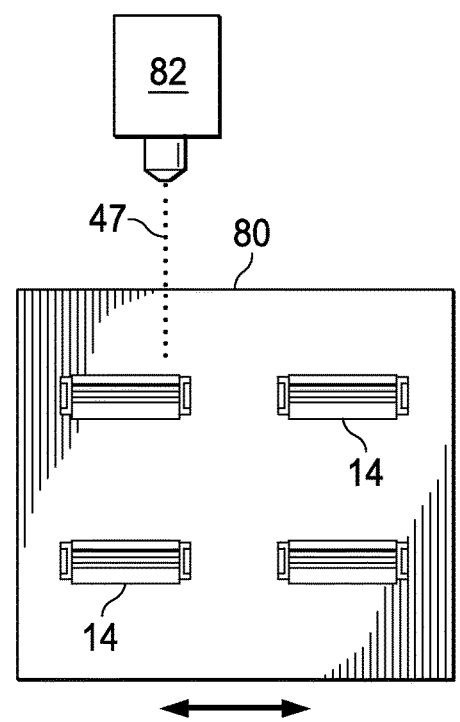

Alternatively, as shown in FIG. 7A and FIG. 7B, in order to print the desired object of certain dimensions on the razor blade, a single print head 72 or 82 may traverse over a stack of razor blades 50 or a bed of razor cartridges 14, back and forth, or multiple times, and as many times as necessary to print the desired printed object.

Figure 8:
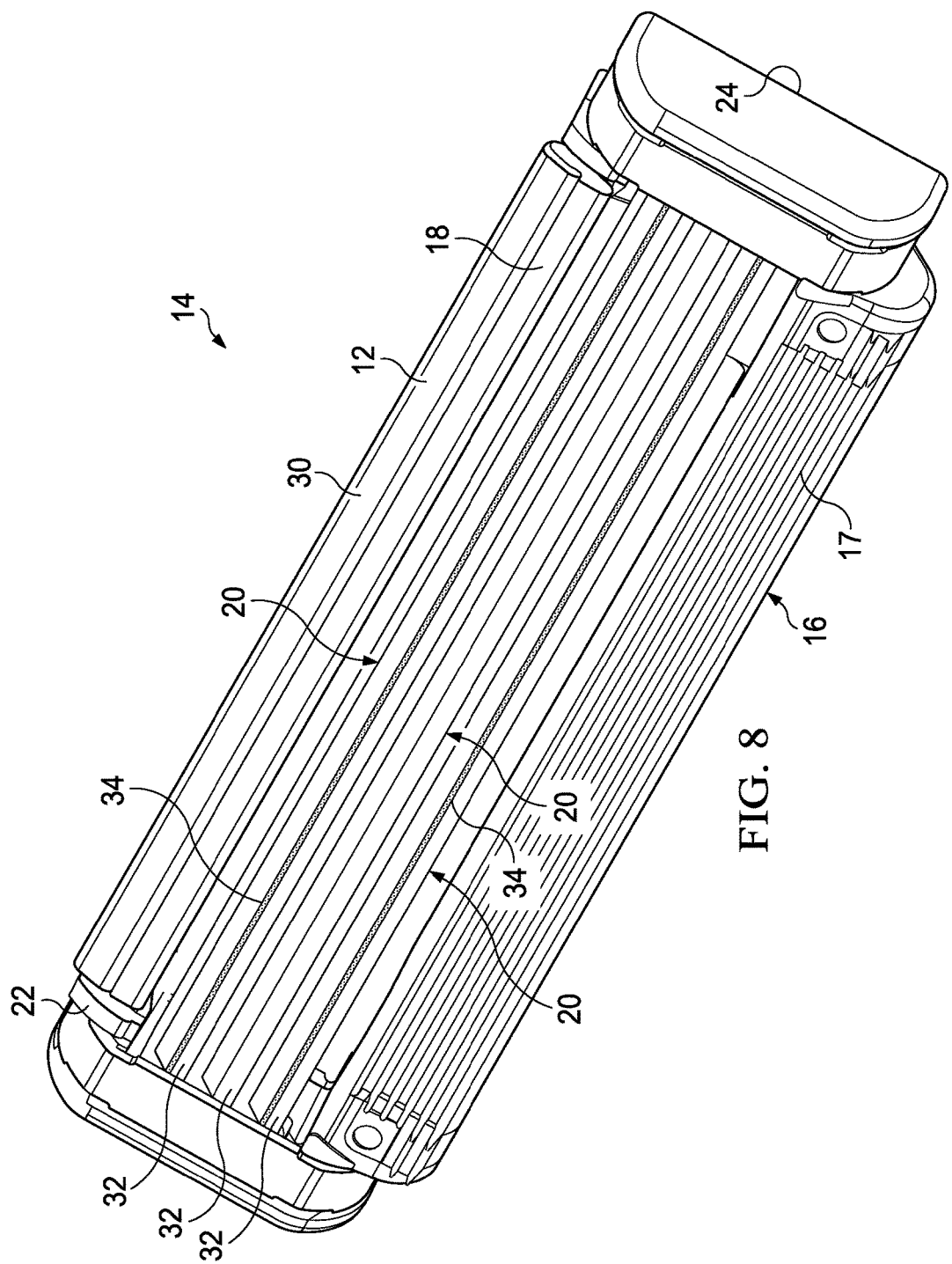
FIG. 8 is a perspective view of another razor cartridge of the present invention.

Referring to FIG. 8, the razor cartridge 14 includes a guard 16 positioned at a front portion of the cartridge 14, a cap 18 positioned at a back portion of cartridge 14, and blades 20 positioned between guard 16 and cap 18. Cartridge 14 includes a top surface 22 and an opposing bottom surface 24. Lubricating members 30 are positioned on the top surface 22 of the cartridge 14. Razor blades 20 each have a visible surface 32 across the top surface 22. The guard 16 includes flexible protrusions 17 in the form of flexible fins extending generally parallel to the one or more elongated blades 20.

The blades 20 along with the lubricating members 30, guard 16, and cap 18 form skin engaging portions of the cartridge 14. The razor blades 20 are located on the cartridge such that they contact or engage the skin during the hair removal process.

Figure 9:
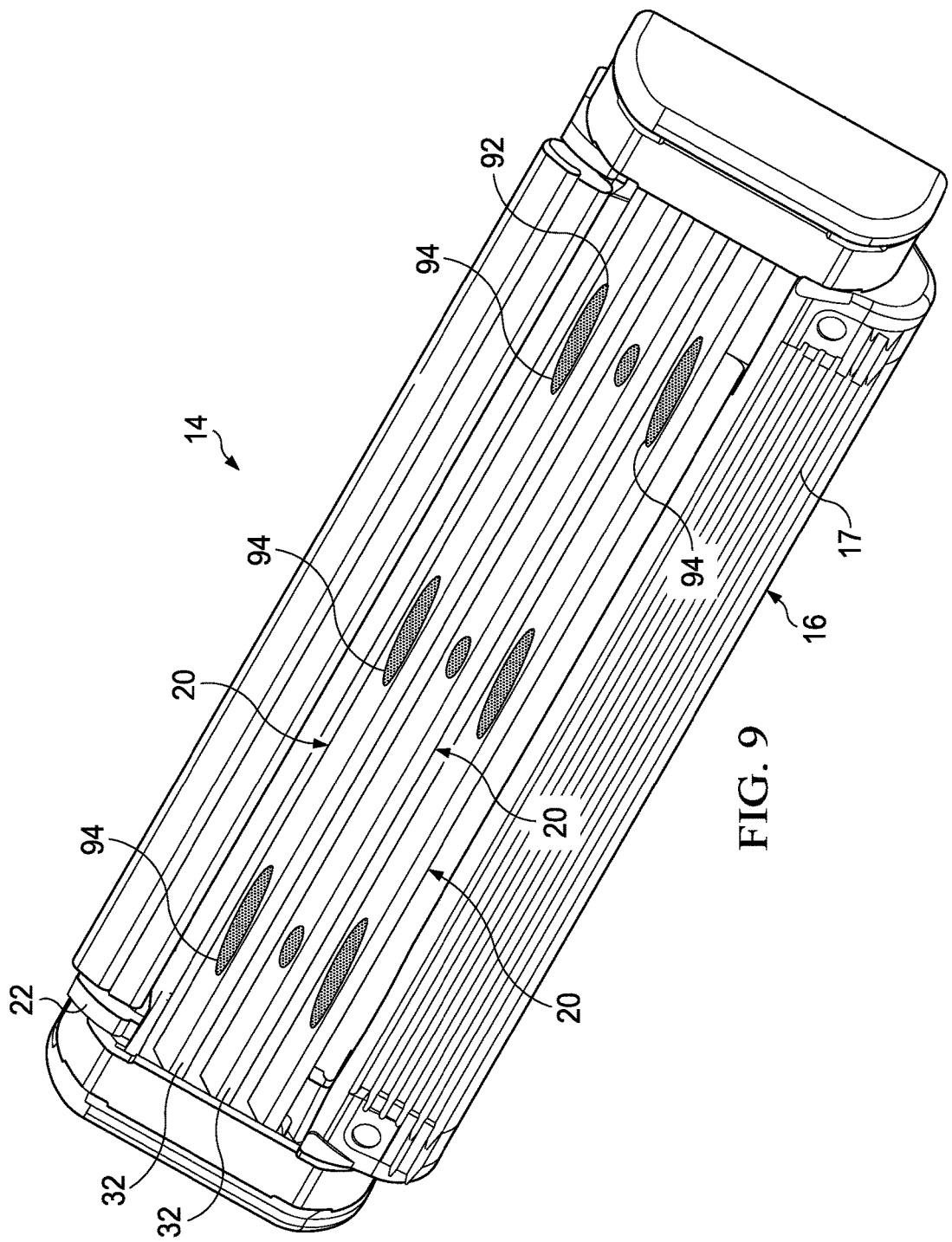
FIG. 9 is a perspective view of another razor cartridge of the present invention.

The visible surfaces 32 of razor blades 20 each include printed objects 34 as shown in FIG. 8. The printed object 34 is in the form of a continuous strip in a cone-like shape extending along the length of the visible surface 32 of razor blade 20. The printed object 34 may be in the form of spaced apart segments 92 extending along the length of the visible surface 32 of razor blade 20 as shown in FIG. 9. The printed objects 34 appear as solid objects 46 to a viewer's naked eye when the perpendicular distance between the viewer's eye and the visible surface is about 30 centimeters. The printed objects 34 have a visible boundary 94. Visible boundary 94 defines the shape and size of the printed object 34 clearly separating it for adjacent unprinted portions of razor blade 20.

Figure 10:
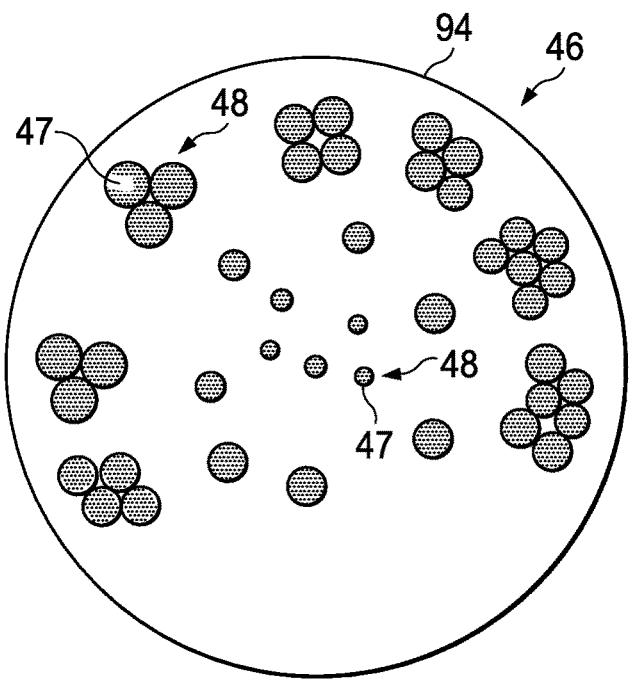
FIG. 10 is a plan view of a solid object.

Referring now to FIG. 10 there is shown a solid object 46 having a boundary 84. As can be seen the size of the printed dots 48 near the boundary are larger than printed dots near the center of solid object 46. The spacing between adjacent printed dots 48 is smaller near the boundary 94 than the spacing between printed dots 48 near the center of the solid object 46. The printed dots 48 near the boundary 94 comprise three or more droplets 47. The printed dots 48 near the center comprise a single droplet 47. The printed dots 48 between the boundary and the center comprise a single droplet 47 having a size and or area larger than the droplets near the center.

Figure 11:
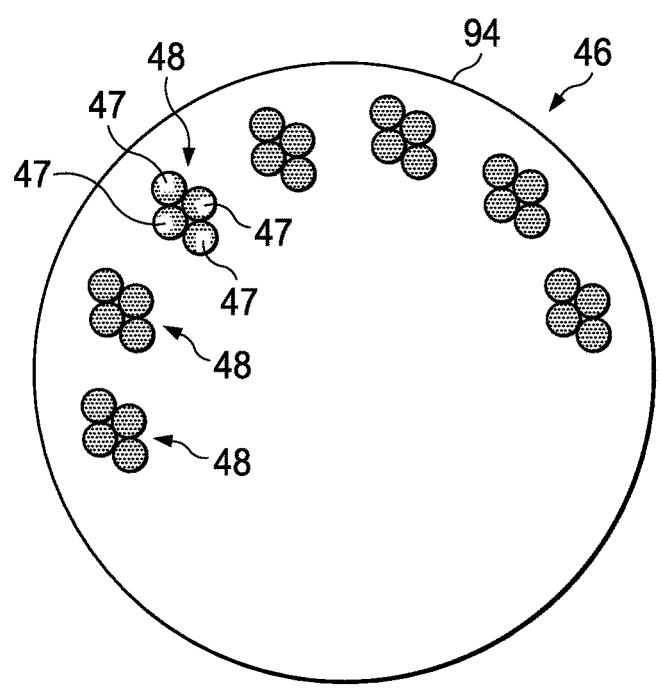
FIG. 11 is a plan view of a solid object.

Referring now to FIG. 11 there is shown a solid object 46 having a boundary 94. As can be seen the size of the printed dots 48 is the same throughout the solid object 46. The spacing between adjacent printed dots 48 is the same throughout the solid object 46. The printed dots 48 comprise four droplets.

It should be understood that every maximum numerical limitation given throughout this specification includes every lower numerical limitation, as if such lower numerical limitations were expressly written herein. Every minimum numerical limitation given throughout this specification includes every higher numerical limitation, as if such higher numerical limitations were expressly written herein. Every numerical range given throughout this specification includes every narrower numerical range that falls within such broader numerical range, as if such narrower numerical ranges were all expressly written herein.

All parts, ratios, and percentages herein, in the Specification, Examples, and Claims, are by weight and all numerical limits are used with the normal degree of accuracy afforded by the art, unless otherwise specified.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

All documents cited in the DETAILED DESCRIPTION OF THE INVENTION are, in the relevant part, incorporated herein by reference; the citation of any document is not to be construed as an admission that it is prior art with respect to the present invention. To the extent that any meaning or definition of a term or in this written document conflicts with any meaning or definition in a document incorporated by reference, the meaning or definition assigned to the term in this written document shall govern. Except as otherwise noted, the articles "a," "an," and "the" mean "one or more."

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method of making a razor blade for a razor cartridge, comprising the steps of:
   a. providing a razor blade, the razor blade having a first side, an opposing second side, a cutting edge extending along a length of said razor blade;

b. printing at least one printed object on said length of said razor blade wherein said at least one printed object comprises a plurality of solid objects of one or more printed dots.

2. The method of claim 1, wherein said at least one printed object is on the first side of the razor blade.

3. The method of claim 1, wherein said at least one printed object is adjacent to the cutting edge.

4. The method of claim 1, wherein said at least one printed object is on a blade body portion.

5. The method of claim 1, wherein said at least one printed object comprises a surface adapted to contact a skin surface of a user during a normal use of the razor cartridge.

6. The method of claim 1 wherein said at least one printed object extends continuously along the length of said razor blade.

7. The method of claim 1 wherein said at least one printed object comprises a pathway structure.

8. The method of claim 1, wherein said printing is inkjet printing.

9. The method of claim 8, wherein an ink used in said inkjet printing is UV curable ink.

10. The method of claim 9 wherein said ink comprises a polymer.

11. The method of claim 9 wherein said ink is a flexible type.

12. The method of claim 1, wherein the at least one printed object has a height dimension of from about 0.04 mm to about 0.20 mm as measured in a direction perpendicular to one of said sides of the razor blade.

13. The method of claim 1, wherein the at least one printed object is printed on said razor blade at a distance of about 0.2 mm and about 0.8 mm back from a blade edge.

14. The method of claim 13 wherein step (b) is repeated until a three-dimensional structure of a plurality of printed dots is formed.

15. The method of claim 13, wherein said 3-D structure is a cone shape.

16. The method of claim 13, wherein said 3-D structure comprises one or more colors.

17. The method of claim 13, wherein free portions within the solid object comprise no printed dots.

18. The method of claim 13 wherein there are substantially no free portions between said printed dots.

19. The method of claim 1 wherein said at least one printed object is visible to a user.

* * * * *